(12) United States Patent
Ohno

(10) Patent No.: US 8,077,879 B2
(45) Date of Patent: Dec. 13, 2011

(54) AUDIO OUTPUT APPARATUS AND TELEVISION BROADCAST RECEIVER

(75) Inventor: Shinichi Ohno, Osaka (JP)

(73) Assignee: Funai Electric Co., Ltd., Daito-shi, Osaka (JP)

( * ) Notice: Subject to any disclaimer, the term of this patent is extended or adjusted under 35 U.S.C. 154(b) by 1282 days.

(21) Appl. No.: 11/784,699

(22) Filed: Apr. 9, 2007

(65) Prior Publication Data

US 2007/0252917 A1 Nov. 1, 2007

(30) Foreign Application Priority Data

Apr. 13, 2006 (JP) .............................. 2006-002793 U

(51) Int. Cl.
*H04B 15/00* (2006.01)
*H04N 5/60* (2006.01)

(52) U.S. Cl. ........................... 381/94.5; 381/55; 348/738

(58) Field of Classification Search .................... 381/55, 381/94.1–94.8; 348/725, 736, 738
See application file for complete search history.

(56) References Cited

U.S. PATENT DOCUMENTS

| 5,029,005 | A | | 7/1991 | Morris, Jr. | |
|---|---|---|---|---|---|
| 5,103,315 | A | * | 4/1992 | Kufta et al. | 348/632 |
| 5,199,079 | A | | 3/1993 | Anderson et al. | |
| 5,204,973 | A | * | 4/1993 | Sugayama | 455/212 |
| 5,442,617 | A | | 8/1995 | Kim et al. | |
| 7,796,195 | B2 | * | 9/2010 | Tseng et al. | 348/632 |
| 2007/0064953 | A1 | * | 3/2007 | Ishida et al. | 381/55 |
| 2008/0137882 | A1 | * | 6/2008 | Tsai et al. | 381/94.5 |
| 2009/0051825 | A1 | * | 2/2009 | Asayama et al. | 348/738 |

FOREIGN PATENT DOCUMENTS

| DE | 9211278 U | 3/1993 |
|---|---|---|
| EP | 0862265 A | 9/1988 |
| EP | 1154568 A | 11/2001 |
| JP | 63-236485 | 10/1988 |
| JP | 04-217818 | 8/1992 |
| JP | 04-220093 | 8/1992 |
| JP | 06-334937 | 12/1994 |
| JP | 08-213849 | 8/1996 |
| JP | H08-279740 A | 10/1996 |
| JP | 2003-204591 | 7/2003 |

OTHER PUBLICATIONS

The extended European search report includes, pursuant to Rule 62 EPC, the supplementary European search report (Art. 153(7) EPC) and the European search opinion, Apr. 2, 2009.

* cited by examiner

*Primary Examiner* — Xu Mei

(74) *Attorney, Agent, or Firm* — Yokoi & Co., U.S.A., Inc.; Toshiyuki Yokoi

(57) ABSTRACT

When an abnormality occurs in a supply circuit and its output is decreased, a protect circuit detects the abnormality and outputs a protect signal to an audio circuit. The audio circuit upon detection of the protect signal stops outputting audio so that outputting of an audio noise due to a deficiency in the supplied voltage is prevented. Meanwhile, when no abnormality occurs in the supply circuit, a microcomputer controls the audio circuit by supplying it with such a signal as to allow it to output an audio, or to increase the audio volume, or with a mute signal.

5 Claims, 5 Drawing Sheets

US 8,077,879 B2

AUDIO OUTPUT APPARATUS AND TELEVISION BROADCAST RECEIVER

CROSS-REFERENCES TO RELATED APPLICATIONS

The present application is related to the Japanese Utility Model Application No. 2006-002793, filed Apr. 13, 2006, the entire disclosure of which is expressly incorporated by reference herein.

BACKGROUND OF THE INVENTION (1) Field of the Invention

The present invention relates to an audio output apparatus and a television broadcast receiver.

(2) Description of the Related Art

In a conventional electronic apparatus such as a television broadcast receiver provided with an audio output apparatus, a muting operation of the audio circuit has been executed by a personal computer. FIG. 4 shows a schematic block diagram of a conventional audio output apparatus and FIG. 5 shows a timing chart indicating timing of the muting operation executed in the conventional audio output apparatus.

Referring to FIG. 4, the conventional audio output apparatus 5 is substantially made up of a supply circuit 1, audio circuit 2, microcomputer 3, and protect circuit 4.

The supply circuit 1 receives a supply voltage from an external commercial power supply or the like and generates various voltages based on the supply voltage to supply the voltages to respective components such as the supply circuit 1, audio circuit 2, and microcomputer 3 of the audio output apparatus 5. The audio circuit 2 receives an audio signal, applies predetermined audio processing to the audio signal, and outputs the resultant signal to a speaker or the like (not shown).

The microcomputer 3 is electrically connected with each of the components forming the audio output apparatus 5. The CPU as an internal component of the microcomputer 3 controls the entirety of the audio output apparatus 5 in accordance with programs written in the ROM and RAM also being the internal components of the microcomputer 3.

The protect circuit 4 monitors the output voltage of the supply circuit 1 and outputs a protect signal to the microcomputer 3 when an abnormal increase or decrease in the output voltage occurs. The microcomputer 3, upon receipt of the protect signal, outputs a mute signal to the audio circuit 2 to cause the audio circuit 2 to stop outputting of the audio signal to the speaker or the like.

Operations performed in the audio output apparatus 5 during the period from when the power supply voltage to the supply circuit 1 is stopped to when the outputting of the audio signal from the audio circuit 2 is stopped will be described with reference to the timing chart of FIG. 5. When the power supply to the supply circuit 1 is stopped on account of removal of the AC cord as shown in the drawing, for example, the supply voltage output from the supply circuit 1 gradually decreases and hence the protect circuit 4 detects the decrease and outputs a protect signal.

Upon receipt of the protect signal, the microcomputer 3 generates a mute signal for muting the audio circuit 2 and outputs it to the audio circuit 2. Since, upon receipt of the mute signal, the audio circuit 2 stops outputting of the audio signal, even if the voltage supply from the power supply circuit then becomes deficient so as to generate an audio signal to cause an audio noise (pop sound), the audio signal to cause the audio noise is not output from the audio circuit 2 to the speaker or the like.

Configurations similar to the above apparatus that is controlled by a microcomputer so as to mute the audio signal when the supply of power voltage has been abruptly stopped are disclosed in Japanese Unexamined Patent Application Publication Nos. H4-220093, S63-236485, and H4-217818.

When the conventional method as described above was carried out, however, it sometimes occurred that the power supply from the supply circuit 1 to the audio circuit 2 became deficient before the microcomputer 3 output the mute signal. Therefore, sometimes the audio circuit 2 was turned off before the mute signal from the microcomputer 3 arrived at the audio circuit 2. Hence, there was a possibility that an audio noise was output to the speaker or the like.

BRIEF SUMMARY OF THE INVENTION

The present invention discloses an audio output apparatus and a television broadcast receiver capable of positively muting the audio circuit 2 before power supply to the audio circuit 2 is turned off in the event of an abnormality in the supply circuit.

One aspect of the present invention provides an audio output apparatus for applying signal processing to an audio signal input thereto and outputting the resultant signal to a speaker comprising: a supply circuit for generating various voltages from a supply voltage supplied from outside and outputting the generated voltages; an audio circuit supplied with a supply voltage from said supply circuit performs an audio signal process, and stops the audio output upon receipt of a mute signal; a protect circuit for outputting a protect signal upon detection of an abnormality in said supply circuit; a microcomputer for outputting a mute signal to said audio circuit upon receipt of the protect signal, and said protect circuit, upon detection of the abnormality, turns the protect signal into a mute signal and outputs the mute signal to said audio circuit.

An optional aspect of the present invention provides an audio output apparatus, wherein the mute signal is set High when an audio is to be output and set Low when the audio is to be muted, and said audio circuit is muted when the signal at Low is input thereto.

Another aspect of the present invention provides A television broadcast receiver for receiving a television broadcast signal for displaying a video of a video signal based on the television broadcast signal on a screen and outputting an audio of an audio signal based on the television broadcast signal from a speaker, comprising: an audio output apparatus supplied with an audio signal for applying signal processing to the audio signal and outputting a resultant signal to a speaker, said audio output apparatus comprising: a supply circuit supplied with a supply voltage from an external commercial power supply through an AC cord for generating various voltages based on the supply voltage and supplying the voltages to respective components of the television broadcast receiver; an audio circuit amplifying an audio signal input thereto in accordance with a volume control signal of 0-5V output from a microcomputer and outputting the audio signal to a speaker when a high voltage signal is input thereto, and stopping the outputting of the audio signal when a mute signal being a low voltage signal is input thereto; a protect circuit coupled with an output line of said supply circuit for outputting a protect signal represented by a low voltage signal when the output voltage of said supply circuit is decreased below a predetermined value; the microcomputer controlling said audio circuit to amplify the audio signal and outputting, upon receipt of the protect signal from said protect circuit, a mute signal to said audio circuit; and a diode disposed to connect a line through which the protect signal from said protect circuit is output and a line connecting said microcomputer and said audio circuit, such that a cathode side thereof is turned toward the line through which the protect signal is output; when the output voltage of said supply circuit begins to decrease, said protect circuit detects the decrease and outputs the low voltage signal as the protect signal, the line connecting said microcomputer and said audio circuit is pulled to low voltage substantially identical to the level of the protect signal thorough said diode, so that the mute signal being the low voltage signal is input to the audio circuit to mute the audio circuit. These and other features, aspects, and advantages of the invention will be apparent to those skilled in the art from the following detailed description of preferred non-limiting exemplary embodiments, taken together with the drawings and the claims that follow.

BRIEF DESCRIPTION OF THE DRAWINGS

It is to be understood that the drawings are to be used for the purposes of exemplary illustration only and not as a definition of the limits of the invention. Throughout the disclosure, the word "exemplary" is used exclusively to mean "serving as an example, instance, or illustration." Any embodiment described as "exemplary" is not necessarily to be construed as preferred or advantageous over other embodiments.

Referring to the drawings in which like reference character(s) present corresponding parts throughout.

DETAILED DESCRIPTION OF THE INVENTION

The detailed description set forth below in connection with the appended drawings is intended as a description of presently preferred embodiments of the invention and is not intended to represent the only forms in which the present invention may be constructed and or utilized.

A preferred embodiment of the present invention will be described below in the below mentioned order:

(1) General configuration of a television broadcast receiver;
(2) Muting circuit; and
(3) Summary.

Figure 1:
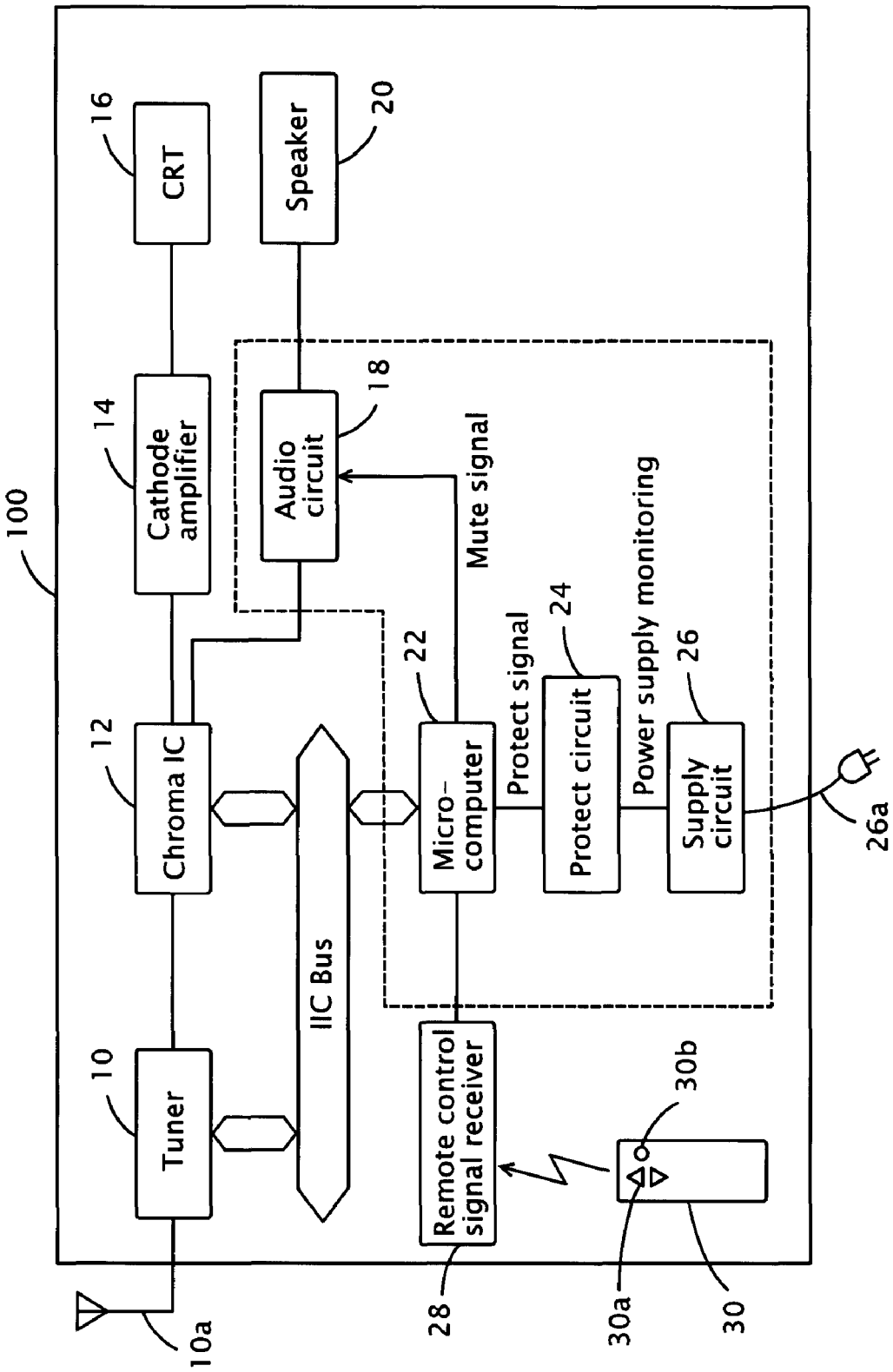
FIG. 1 is an exemplary illustration of a block diagram explanatory of a general configuration of a television broadcast receiver 100 according to a present embodiment.

(1) General Configuration of a Television Broadcast Receiver:

FIG. 1 is a block diagram showing a general configuration of the television broadcast receiver 100 of the present embodiment. Incidentally, detailed description and drawings will be omitted of components of the television broadcast receiver 100 that are not directly related with the present invention. While the present embodiment will be explained as applied to a television broadcast receiver as an example of electric/electronic equipment mounting an audio output apparatus thereon, it is not limitative, but it is also applicable to various kinds of electric/electronic equipment such as a stereo or radio that outputs an audio.

Referring to FIG. 1, the television broadcast receiver 100 is substantially made up of a tuner 10, chroma IC 12, cathode amplifier 14, CRT 16, audio circuit 18, speaker 20, microcomputer 22, supply circuit 26, protect circuit 24, remote control receiver 28, and remote controller 30.

The tuner 10 is connectable with an antenna 10a as an input source of a broadcast signal. The tuner 10 receives signals of a desired frequency band, selects from the received signals a signal of a required frequency, applies high-frequency-amplification to the selected signal, converts the high frequency signal into an intermediate frequency signal, and outputs the resultant signal.

The chroma IC 12 generally applies intermediate-frequency amplification to the intermediate-frequency signal input thereto at a suitable gain to thereby perform video detection and audio detection, and, on one hand, applies a predetermined chrominance demodulation to the detected video output and outputs it as an RGB signal and, on the other hand, outputs the detected audio signal as an audio signal. The RGB signal is output to the external cathode amplifier 14 and the signal is suitably amplified in the cathode amplifier 14 to be supplied to the CRT 16. Meanwhile, the audio signal is also fed to the audio circuit 18 external to the chroma IC 12 and suitably amplifier in the audio circuit 18 to be supplied to the speaker 20.

The audio circuit 18, supplied with the power voltage from the supply circuit 26, performs audio signal processing and, if a mute signal is input thereto, stops the audio outputting. The mute signal is such a signal that goes High when an audio is to be output and goes Low when the audio is to be muted. The audio circuit 18 mutes upon receipt of the Low signal.

In the microcomputer 22, its internal component CPU performs, based on programs written in ROM and RAM being also the internal components of the CPU, the overall control of the television broadcast receiver 100 such us the channel selection control of the tuner 10 and the audio control and mute control of the audio circuit. The microcomputer 22 and the above tuner 10 and the chroma IC 12 are connected with a predetermined IIC bus and they are allowed to communicate with each other via the IIC bus. Further, when the microcomputer 22 has received a voltage signal from the remote control receiver 28 and detected a key operation corresponding to the voltage signal, it accepts the operating input from the remote control 30 to perform such control as volume control and mute control of the audio circuit.

The supply circuit 26 is supplied with a power voltage from an external commercial power supply or the like through an AC cord or the like and generates various voltages based on the power voltage and outputs the voltages. Though it is not shown in FIG. 1, the supply circuit 26 is supplying power voltages to each component of the television broadcast receiver 100.

The protect circuit 24 is connected to either the output line or the input line of the supply circuit 26 and monitors an abnormality of the current or voltage of the supply circuit 26. Upon detection of an abnormality, it outputs a protect signal to the microcomputer 22. The protect circuit 24, for example, is a circuit that is connected to the output line of the supply circuit 26 and outputs a protect signal when the output voltage decreases below a predetermined value. More concretely, a circuit that has a comparator having the output voltage (Va) of the supply circuit 26 and a predetermined reference voltage (Vb) input thereto and is adapted to output different signals depending on the magnitude relationship between the voltages Va and Vb, or a circuit that uses a resistor, switching element, rectifying element, and the like and detects an abnormality of the output voltage in the supply circuit to output the relevant signal, may be considered as the protect circuit 24.

Upon receipt of a protect signal, the microcomputer 22 outputs a control signal for normally stopping the television broadcast receiver 100 or performs a process to normally stop the control program of the microcomputer 22 itself More concretely, it performs such control as to mute the audio circuit 18 by outputting a mute signal to the audio circuit 18.

The remote control receiver 28, upon receipt of a command signal sent from the remote controller 30, generates a corresponding voltage signal. The remote controller 30 includes various buttons that are normally used for controlling the television broadcast receiver 100 such as ON/OFF buttons and channel select buttons, not shown, and the volume buttons 30*a* for controlling the volume up/down and the mute button 30*b* for the muting.

Figure 2:
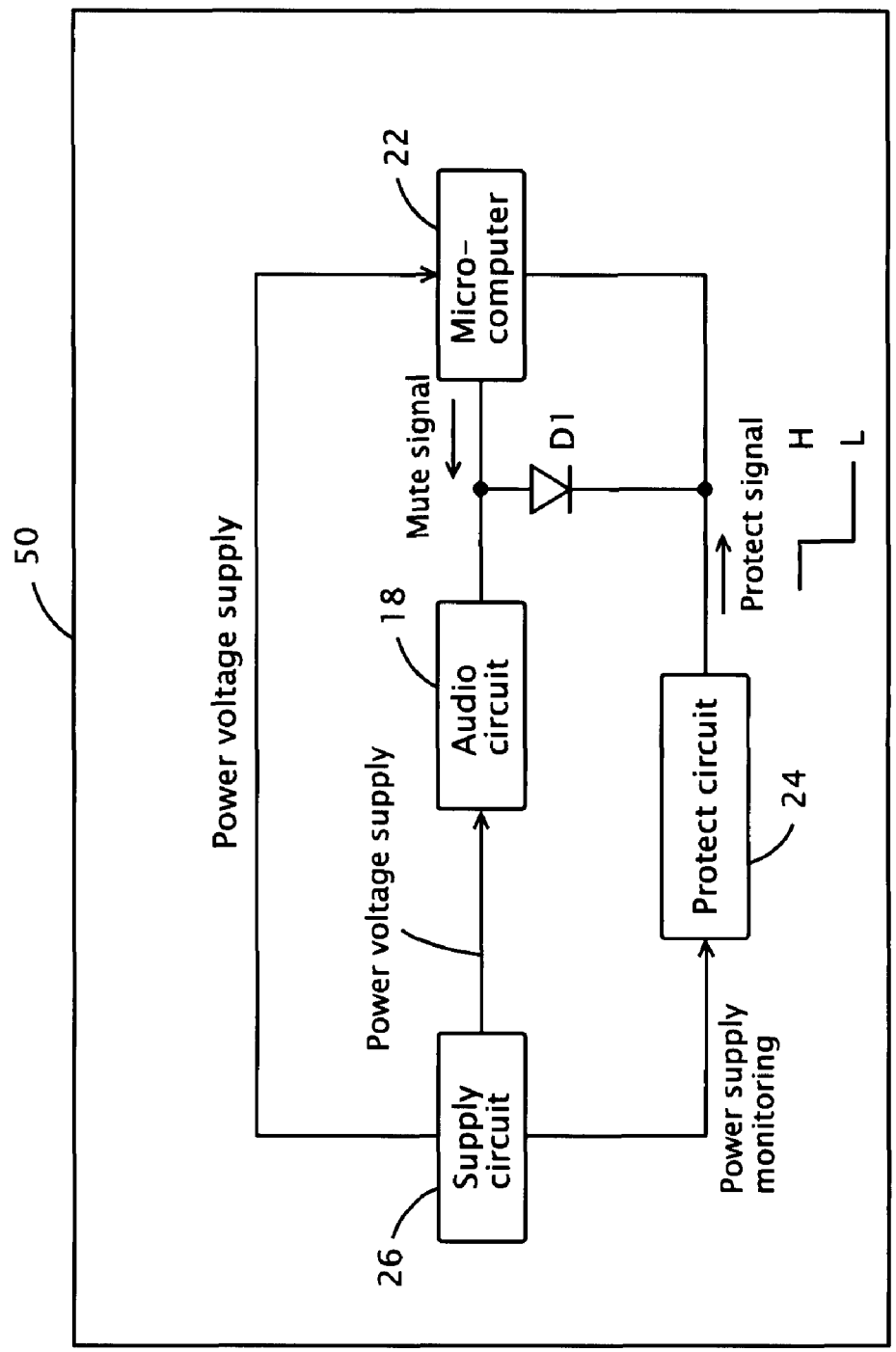
FIG. 2 is an exemplary illustration of a block diagram explanatory of circuitry for performing a muting operation in a present embodiment.

(2) Muting Circuit Configuration:

Referring to FIG. 2, a circuit configuration for performing the muting operation in the present embodiment will be described. The figure shows a block diagram of circuits related to the muting operation in the television broadcast receiver 100 and their mutual relationships. Incidentally, if an audio signal from some sound source is arranged to be input to the circuit configuration of FIG. 2, an audio output apparatus may also be provided only by the same configuration.

FIG. 2 shows a supply circuit 26, audio circuit 18, microcomputer 22, and protect circuit 24, in which the audio circuit 18 and microcomputer 22 are supplied with power voltages from the supply circuit 26.

The audio circuit 18, in response to a volume control signal input from the microcomputer 22 ranging 0 to 5V, determines the amplification factor of the audio signal output therefrom. More specifically, the higher the voltage value of the volume control signal, the greater becomes the amplification factor of the output audio signal, and the lower the voltage value of the volume control signal, the smaller becomes the amplification factor; when the voltage value of the volume control signal is 0V, the muting operation is performed. Of course, a muting control may be executed separately from the volume control. In such case, the signal allowing the audio circuit to output an audio signal may be set High (voltage On) and the signal not allowing it to output an audio signal may be set Low (no voltage).

Further, the line through which the microcomputer 22 outputs the mute signal to the audio circuit 18 and the line through which the protect circuit 24 outputs the protect signal to the microcomputer 22 are connected by the diode D1 as shown in FIG. 2. Referring to FIG. 2, the diode D1 is connected such that its anode side is turned toward the line mentioned first above and its cathode side is turned toward the line mentioned second above.

By virtue of the function of the diode D1, the protect signal is prevented from entering into the microcomputer 22 and the audio circuit 18 when the supply circuit 26 is normally outputting its output and, thereby, the microcomputer 22 and audio circuit 18 are prevented from making a malfunction. However, when a Low (0V) protect signal is output from the protect circuit 24 upon occurrence of an abnormality in the supply circuit 26, the line connecting the microcomputer 22 and the audio circuit 18 is pulled to Low. Therefore, even if a High signal is being output from the microcomputer 22, a Low signal is input to the audio circuit 18 and, thus, the audio circuit 18 is muted regardless of the control of the microcomputer 22.

Further, when the supply voltage to the supply circuit 26 is cut off by such a reason as the AC cord being pulled out of the wall, the protect signal is output at timing earlier than the occurrence of an audio noise in the audio circuit 18 on account of the voltage supplied to the audio circuit 18 becoming deficient.

Figure 3:
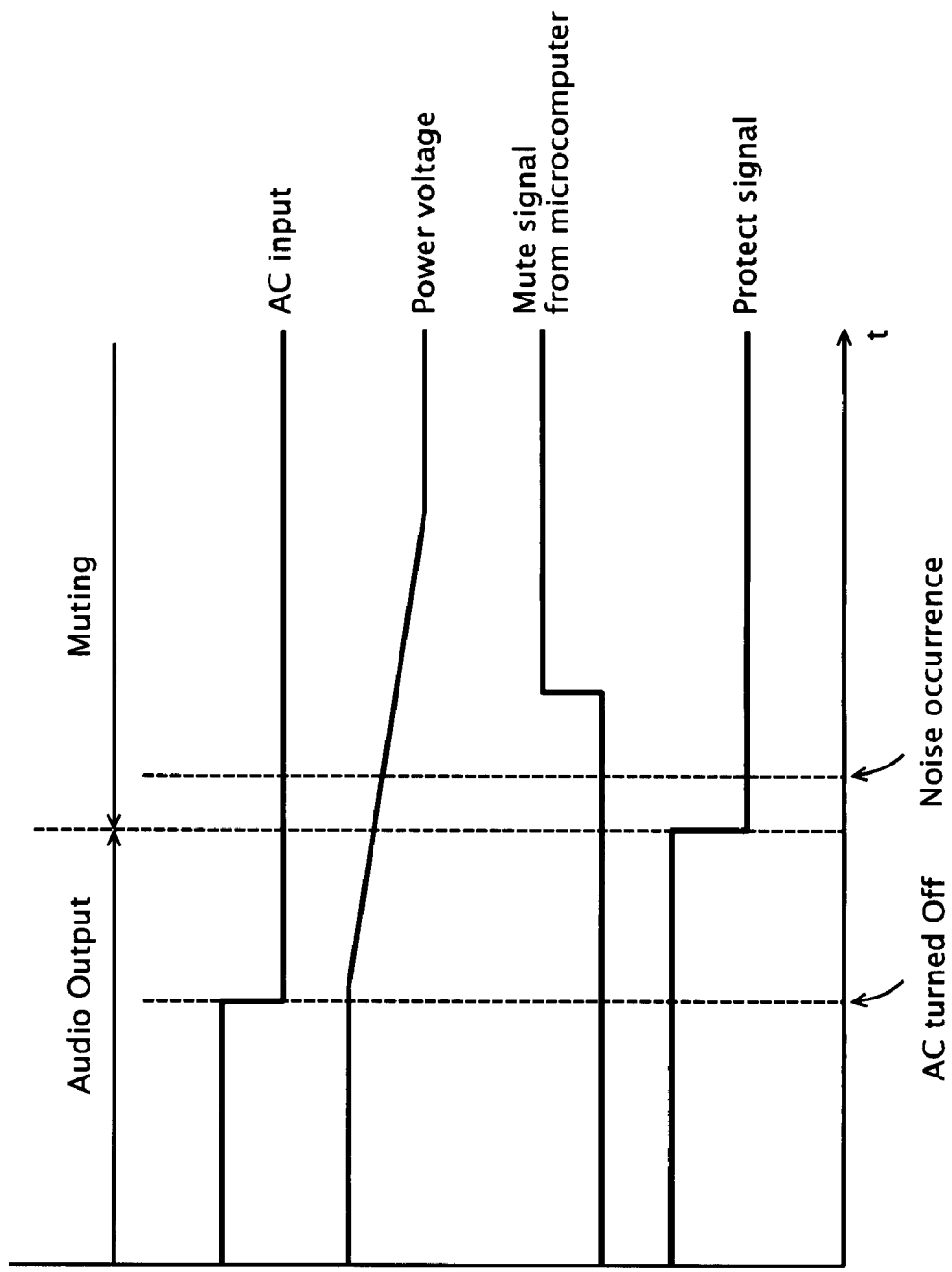
FIG. 3 is an exemplary illustration of a timing chart showing timing of a muting operation in a present embodiment.
Figure 4:
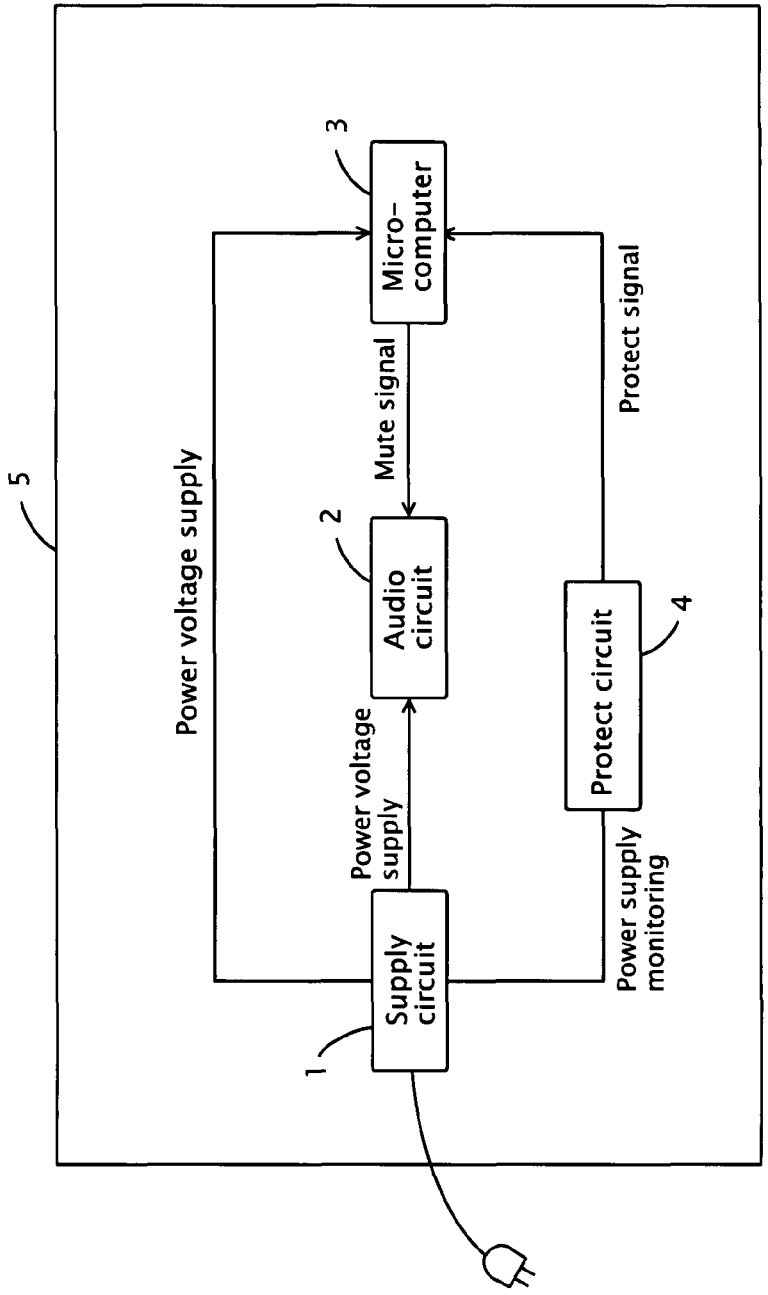
FIG. 4 is an exemplary illustration of a schematic block diagram of a conventional audio output apparatus.
Figure 5:
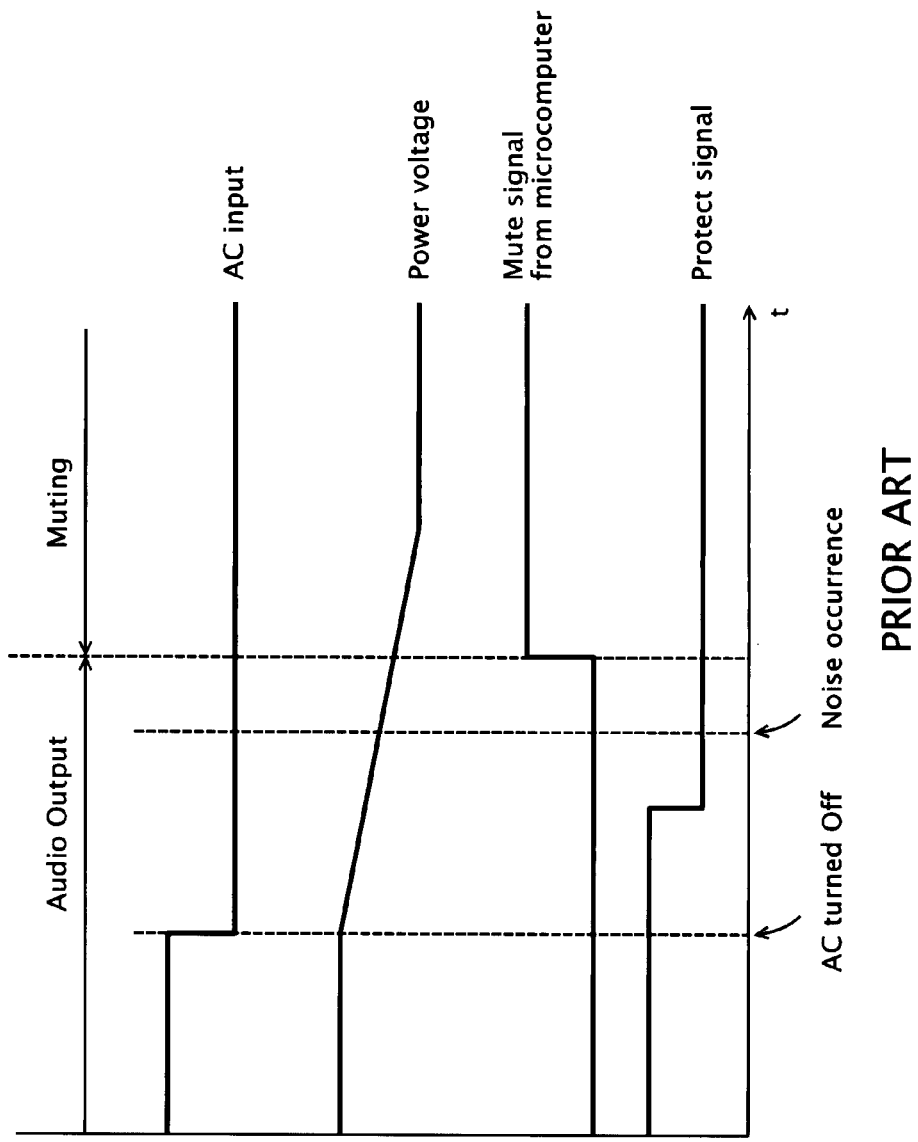
FIG. 5 is an exemplary illustration of a timing chart showing timing of a muting operation in a conventional audio output apparatus.

Now, the operation related to the muting control will be described with reference to the timing chart of FIG. 3. FIG. 3 is a timing chart showing timing of the muting control executed in the present embodiment.

When the output voltage from the supply circuit 26 begins to decrease by such a reason as that the AC cord has been pulled out of the wall, the protect circuit 24 detects the decrease in the voltage and outputs a protect signal at Low. At this point, the microcomputer 22 has not yet received the Low protect signal and, therefore, it has not yet output a mute signal (Low) to the audio circuit 18 but is outputting a signal (High) to cause the audio output to be made. Hence, the audio circuit 18 is outputting the audio output.

When the protect signal is turned Low, the line connecting the microcomputer 22 and the audio circuit 18 is pulled to Low, the same level as the protect signal, via the diode D1, and therefore, the signal (High) output from the microcomputer 22 to cause the audio output to be made flows into the diode D1, not reaching the audio circuit 18. Thus, a mute signal (Low) is input to the audio circuit 18 so that the audio circuit 18 is muted.

Although, an audio noise occurs in the audio circuit 18 when the voltage supplied from the supply circuit 26 to the audio circuit 18 becomes deficient, an audio signal causing the audio noise is not output from the audio circuit 18 because the audio signal has been muted.

(3) Summary:

In brief, when the output of the supply circuit 26 decreases due to occurrence of an abnormality in it, the protect circuit 24 detects the abnormality and outputs a protect signal to the audio circuit 18. Therefore, the audio circuit 18 having received the protect signal stops its audio output such that an audio noise due to the deficiency of the supplied voltage thereto is not output. When no abnormality occurs in the supply circuit 26, the microcomputer 22 controls the audio circuit 18 by outputting thereto such signals as to allow the audio circuit 18 to output an audio, or increase the volume of the audio, or to mute the audio.

The audio output apparatus of the present invention, as described above, is, in an audio output apparatus for applying signal processing to an audio signal input thereto and outputting the resultant signal to a speaker comprising: a supply circuit for generating various voltages from a supply voltage supplied from outside and outputting the generated voltages; an audio circuit supplied with a supply voltage from said supply circuit performs an audio signal process, and stops the audio output upon receipt of a mute signal; a protect circuit for outputting a protect signal upon detection of an abnormality in said supply circuit; a microcomputer for outputting a mute signal to said audio circuit upon receipt of the protect signal, and said protect circuit, upon detection of the abnormality, turns the protect signal into a mute signal and outputs the mute signal to said audio circuit.

In the present invention configured as described above, when an abnormality occurs in the supply circuit and its output decreases, the protect circuit detects the abnormality and outputs a protect signal to the audio circuit. The audio circuit, upon receipt of the protect signal, stops its audio output, so that an audio noise due to deficiency in the supplied voltage is not output. Further, in the case where no abnormality occurs in the supply circuit, the microcomputer controls the audio circuit by supplying the audio circuit with such a signal as to allow the audio circuit to output an audio, or to increase the audio volume, or with a mute signal.

For the above mute signal it is enough if it can mute the above audio circuit and, therefore, various signals may be used as the mute signal. For example, it may be a voltage signal of a value greater than a predetermined threshold value, a voltage signal of a value smaller than a predetermined threshold value, a voltage signal of 0V, a combination of a plurality of voltage signals, or a combination of the above mentioned signals.

Of the above protect circuit, it is only required that it can detect an abnormality in the supply circuit and output a protect signal, namely, it is enough if it can detect that the output voltage, output current, input voltage, or input current is greatly deviated from the normal value. The above protect signal and the mute signal output from the microcomputer are identical signals when input to the audio circuit.

The present invention configured as described above can provide an audio output apparatus capable of positively muting its audio circuit when an abnormality has occurred in its supply circuit, before the audio circuit is cut off. More specifically, the audio circuit can be muted prior to a muting operation of the audio circuit executed by the microcomputer at such a time as when the AC cord is pulled out of the wall and then the supply voltage to the audio circuit is becoming deficient. Thus, occurrence of such an audio noise as a pop sound can be prevented.

As an exemplary embodiment of the invention, it is configured in the audio output apparatus such that the mute signal is set High when an audio is to be output, and set Low when the audio is to be muted, and the audio signal is muted when the Low signal is input thereto.

Thus, it becomes unnecessary to generate a complicated mute signal. More specifically, the muting operation of the audio circuit is achieved by pulling the High signal output from the microcomputer to Low. Hence, it is made possible to mute the audio circuit when an abnormality has occurred therein by the use of a configuration using simple circuits.

As another exemplary embodiment of the invention, it is configured in the audio output apparatus such that a line through which the protect signal from said protect circuit is output and a line connecting said microcomputer and said audio circuit are connected by a diode, with a cathode side thereof turned toward the line through which the protect signal is output More specifically, the protect signal is prevented from flowing into the microcomputer or the audio circuit and, hence, there is no possibility that the microcomputer or the audio circuit causes a malfunction.

Further, the present invention, in a television broadcast receiver for receiving a television broadcast signal for displaying a video of a video signal based on the television broadcast signal on a screen and outputting an audio of an audio signal based on the television broadcast signal from a speaker, comprising: an audio output apparatus supplied with an audio signal for applying signal processing to the audio signal and outputting a resultant signal to a speaker, said audio output apparatus comprising: a supply circuit supplied with a supply voltage from an external commercial power supply through an AC cord for generating various voltages based on the supply voltage and supplying the voltages to respective components of the television broadcast receiver; an audio circuit amplifying an audio signal input thereto in accordance with a volume control signal of 0-5V output from a microcomputer and outputting the audio signal to a speaker when a high voltage signal is input thereto, and stopping the outputting of the audio signal when a mute signal being a low voltage signal is input thereto; a protect circuit coupled with an output line of said supply circuit for outputting a protect signal represented by a low voltage signal when the output voltage of said supply circuit is decreased below a predetermined value; the microcomputer controlling said audio circuit to amplify the audio signal and outputting, upon receipt of the protect signal from said protect circuit, a mute signal to said audio circuit; and a diode disposed to connect a line through which the protect signal from said protect circuit is output and a line connecting said microcomputer and said audio circuit, such that a cathode side thereof is turned toward the line through which the protect signal is output; when the output voltage of said supply circuit begins to decrease, said protect circuit detects the decrease and outputs the low voltage signal as the protect signal, the line connecting said microcomputer and said audio circuit is pulled to low voltage substantially identical to the level of the protect signal thorough said diode, so that the mute signal being the low voltage signal is input to the audio circuit to mute the audio circuit.

Although the invention has been described in considerable detail in language specific to structural features and or method acts, it is to be understood that the invention defined in the appended claims is not necessarily limited to the specific features or acts described. Rather, the specific features and acts are disclosed as preferred forms of implementing the claimed invention. Therefore, while exemplary illustrative embodiments of the invention have been described, numerous variations and alternative embodiments will occur to those skilled in the art. Such variations and alternate embodiments are contemplated, and can be made without departing from the spirit and scope of the invention.

It should further be noted that throughout the entire disclosure, the labels such as left, right, front, back, top, bottom, forward, reverse, clockwise, counter clockwise, up, down, or other similar terms such as upper, lower, aft, fore, vertical, horizontal, proximal, distal, etc. have been used for convenience purposes only and are not intended to imply any particular fixed direction or orientation. Instead, they are used to reflect relative locations and/or directions/orientations between various portions of an object.

In addition, reference to "first," "second," "third," and etc. members throughout the disclosure (and in particular, claims) is not used to show a serial or numerical limitation but instead is used to distinguish or identify the various members of the group.

What is claimed is:

1. A television broadcast receiver for receiving a television broadcast signal for displaying a video of a video signal based on the television broadcast signal on a screen and outputting an audio of an audio signal based on the television broadcast signal from a speaker, comprising:
an audio output apparatus supplied with an audio signal for applying signal processing to the audio signal and outputting a resultant signal to a speaker,
said audio output apparatus comprising:
a supply circuit supplied with a supply voltage from an external commercial power supply through an AC cord for generating various voltages based on the supply voltage and supplying the voltages to respective components of the television broadcast receiver;
an audio circuit amplifying an audio signal input thereto in accordance with a volume control signal of 0-5V output from a microcomputer and outputting the audio signal to a speaker when a high voltage signal is input thereto, and stopping the outputting of the audio signal when a mute signal being a low voltage signal is input thereto;

a protect circuit coupled with an output line of said supply circuit for outputting a protect signal represented by a low voltage signal when the output voltage of said supply circuit is decreased below a predetermined value;

the microcomputer controlling said audio circuit to amplify the audio signal and outputting, upon receipt of the protect signal from said protect circuit, a mute signal to said audio circuit; and a diode disposed to connect a line through which the protect signal from said protect circuit is output and a line connecting said microcomputer and said audio circuit, such that a cathode side thereof is turned toward the line through which the protect signal is output;

when the output voltage of said supply circuit begins to decrease, said protect circuit detects the decrease and outputs the low voltage signal as the protect signal, the line connecting said microcomputer and said audio circuit is pulled to low voltage substantially identical to the level of the protect signal thorough said diode, so that the mute signal being the low voltage signal is input to the audio circuit to mute the audio circuit.

2. An audio output apparatus for applying signal processing to an audio signal input thereto and outputting the resultant signal to a speaker comprising:

a supply circuit for generating various voltages from a supply voltage supplied from outside and outputting the generated voltages;

an audio circuit supplied with a supply voltage from said supply circuit performs an audio signal process, and stops the audio output upon receipt of a mute signal;

a protect circuit for outputting a protect signal upon detection of an abnormality in said supply circuit;

a microcomputer for outputting the mute signal to said audio circuit upon receipt of the protect signal, and said protect circuit, upon detection of the abnormality, outputs the protect signal as the mute signal to said audio circuit.

3. The audio output apparatus according to claim 2, wherein the mute signal is set High when an audio is to be output and set Low when the audio is to be muted, and said audio circuit is muted when the signal at Low is input thereto.

4. The audio output apparatus according to claim 2, wherein a line through which the protect signal from said protect circuit is output and a line connecting said microcomputer and said audio circuit are connected by a diode, with a cathode side thereof turned toward the line through which the protect signal is output.

5. The audio output apparatus according to claim 2, wherein said protect circuit includes a comparator with the output voltage from said supply circuit and a reference voltage input thereto and outputs the signal at Low when the output voltage of said supply circuit is lower than the reference voltage.

* * * * *